(12) United States Patent
Saito et al.

(10) Patent No.: US 9,287,450 B2
(45) Date of Patent: Mar. 15, 2016

(54) GROUP III NITRIDE SEMICONDUCTOR LIGHT-EMITTING DEVICE

(71) Applicant: TOYODA GOSEI CO., LTD., Kiyosu-shi (JP)

(72) Inventors: Yoshiki Saito, Kiyosu (JP); Yohei Samura, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/451,061

(22) Filed: Aug. 4, 2014

(65) Prior Publication Data

US 2015/0041758 A1   Feb. 12, 2015

(30) Foreign Application Priority Data

Aug. 6, 2013   (JP) ................................. 2013-162956

(51) Int. Cl.
| | |
|---|---|
| H01L 33/00 | (2010.01) |
| H01L 33/22 | (2010.01) |
| H01L 33/36 | (2010.01) |
| H01L 33/06 | (2010.01) |
| H01L 33/32 | (2010.01) |
| H01L 33/12 | (2010.01) |

(52) U.S. Cl.
CPC ............... *H01L 33/22* (2013.01); *H01L 33/32* (2013.01); *H01L 33/12* (2013.01)

(58) Field of Classification Search
None
See application file for complete search history.

(56) References Cited

U.S. PATENT DOCUMENTS

2006/0138445 A1* 6/2006 Zhao et al. .................... 257/102
2012/0012874 A1* 1/2012 Morioka et al. ................ 257/98

FOREIGN PATENT DOCUMENTS

| JP | 2002-280611 A | 9/2002 |
|---|---|---|
| JP | 2012-160502 A | 8/2012 |
| JP | 5150684 B2 | 2/2013 |
| JP | 5176334 B2 | 4/2013 |

* cited by examiner

*Primary Examiner* — Robert Carpenter
(74) *Attorney, Agent, or Firm* — McGinn IP Law Group, PLLC

(57) ABSTRACT

The present invention provides a Group III nitride semiconductor light-emitting device which prevents an increase in driving voltage, and which has low threading dislocation density as a whole. The light-emitting device includes an embossed substrate. The substrate has, on a main surface thereof, a first region in which protrusions are arranged at a small pitch, and second regions in which protrusions are arranged at a large pitch. The second regions correspond to projection areas of a p-pad electrode and an n-pad electrode as viewed through the main surface of the substrate. The first region corresponds to a projection area, as viewed through the main surface of the substrate, of a region in which neither the p-pad electrode nor the n-pad electrode is formed.

20 Claims, 12 Drawing Sheets

GROUP III NITRIDE SEMICONDUCTOR LIGHT-EMITTING DEVICE

BACKGROUND OF THE INVENTION

1. Field of the Invention

The present invention relates to a Group III nitride semiconductor light-emitting device including an embossed substrate.

2. Background Art

In general, a semiconductor light-emitting device includes a substrate; an n-type semiconductor layer, a light-emitting layer, and a p-type semiconductor layer, which layers are deposited in this order on the substrate; and electrodes. Light emitted from the light-emitting layer exits the outside of the device through, for example, outer exposed surfaces (e.g., the upper and side surfaces of the semiconductor layers) or exposed surfaces (e.g., the back surface and side surfaces of the substrate).

When light emitted from the light-emitting layer enters the interface between the semiconductor layer and the electrode or between the semiconductor layer and the substrate at an angle equal to or larger than a specific critical angle, the light propagates, with repeated total reflection, through the interior of the semiconductor layer in a lateral direction; i.e., in a direction parallel to the main surface of the substrate. A portion of the light is absorbed in the semiconductor layer. Thus, the semiconductor light-emitting device exhibits reduced light extraction efficiency.

In view of the foregoing, techniques for improving light extraction efficiency have been developed. For example, Patent Document 1 discloses a semiconductor light-emitting device including a substrate having an embossment on the main surface thereof. Patent Document 1 describes that light propagating in a direction parallel to the main surface of the substrate is reflected by the embossment of the substrate, and the reflected light is emitted in another direction (e.g., in an axial direction) (see paragraph [0021] of Patent Document 1). Also, Patent Document 2 describes a similar technique (see paragraph [0011] of Patent Document 2).

Patent Document 1: Japanese Patent Application Laid-Open (kokai) No. 2002-280611
Patent Document 2: Japanese Patent Application Laid-Open (kokai) No. 2012-160502

As described hereinbelow, the distance between the n-type semiconductor layer and the p-type semiconductor layer at a position where a threading dislocation is present is smaller than that at a position where no threading dislocation is present. Under application of a specific voltage, a stronger electric field is locally generated at a position where the distance between the n-type semiconductor layer and the p-type semiconductor layer is smaller. Thus, electric current is likely to flow at a position where a threading dislocation is present.

When threading dislocation density is lowered in a semiconductor crystal, the semiconductor crystal exhibits improved crystallinity (see paragraph [0005] of Patent Document 2), whereby emission efficiency is improved. Meanwhile, when threading dislocation density is lowered; i.e., the number of threading dislocations, through which electric current is likely to flow, is reduced, driving voltage Vf may be increased (see paragraph [0005] of Patent Document 2). Thus, a trade-off relationship is established between reduction in threading dislocation density and suppression of an increase in driving voltage Vf.

SUMMARY OF THE INVENTION

The present invention has been accomplished for solving problems involved in the aforementioned conventional techniques. Accordingly, an object of the present invention is to provide a Group III nitride semiconductor light-emitting device which prevents an increase in driving voltage, and which has low threading dislocation density as a whole.

In a first aspect of the present invention, there is provided a Group III nitride semiconductor light-emitting device comprising a substrate having an embossed main surface; a Group III nitride semiconductor layer formed on the main surface of the substrate; and non-translucent electrodes which are electrically conducted to the Group III nitride semiconductor layer. The substrate is a heterogeneous substrate having a chemical composition different from that of the Group III nitride semiconductor layer. The heterogeneous substrate has a first region including a plurality of protrusions, and a second region including a plurality of protrusions which are arranged at a pitch larger than that of the protrusions in the first region. The second region has a perimeter being included within a region defined by a region perimeter located 6 µm or less outward from the perimeter of a projection area of each of the non-translucent electrodes as viewed through the main surface of the heterogeneous substrate, and also defined by a region perimeter located 6 µm or less inward from the perimeter of the projection area.

In the Group III nitride semiconductor light-emitting device, the heterogeneous substrate has the first region in which protrusions are arranged at a relatively small pitch, and the second region in which protrusions are arranged at a relatively large pitch. The second region is located below each non-translucent electrode (e.g., a pad electrode). Light radiated onto the second region of the substrate is reflected at a relatively large angle. Therefore, most of the reflected light is not radiated onto the non-translucent electrode, but is emitted to the outside of the device. Thus, the light-emitting device exhibits high light extraction efficiency. Since the second region has a relatively high threading dislocation density, an increase in driving voltage is suppressed in the light-emitting device.

A second aspect of the present invention is drawn to a specific embodiment of the Group III nitride semiconductor light-emitting device, wherein, in the second region, protrusions located more distant from the boundary between the first region and the second region are arranged at a larger pitch.

A third aspect of the present invention is drawn to a specific embodiment of the Group III nitride semiconductor light-emitting device, wherein a relation of L2=a×L1 and a relation of 1.1≤a≤3 are satisfied, wherein L1 represents the pitch between adjacent protrusions in the first region, and L2 represents the pitch between adjacent protrusions in the second region.

A fourth aspect of the present invention is drawn to a specific embodiment of the Group III nitride semiconductor light-emitting device, wherein at least one of the non-translucent electrodes is a pad electrode which is to be electrically conducted to an external electrode.

A fifth aspect of the present invention is drawn to a specific embodiment of the Group III nitride semiconductor light-emitting device, wherein the non-translucent electrodes comprise a plurality of dot electrodes which are distributed with respect to a light-emitting surface, and one or more wiring electrodes for electrically connecting the dot electrodes to the pad electrodes.

A sixth aspect of the present invention is drawn to a specific embodiment of the Group III nitride semiconductor light-emitting device, which comprises a transparent electrode, wherein the Group III nitride semiconductor layer has a p-type contact layer, and the transparent electrode is formed on the p-type contact layer.

The present invention provides a Group III nitride semiconductor light-emitting device which prevents an increase in driving voltage, and which has low threading dislocation density as a whole.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
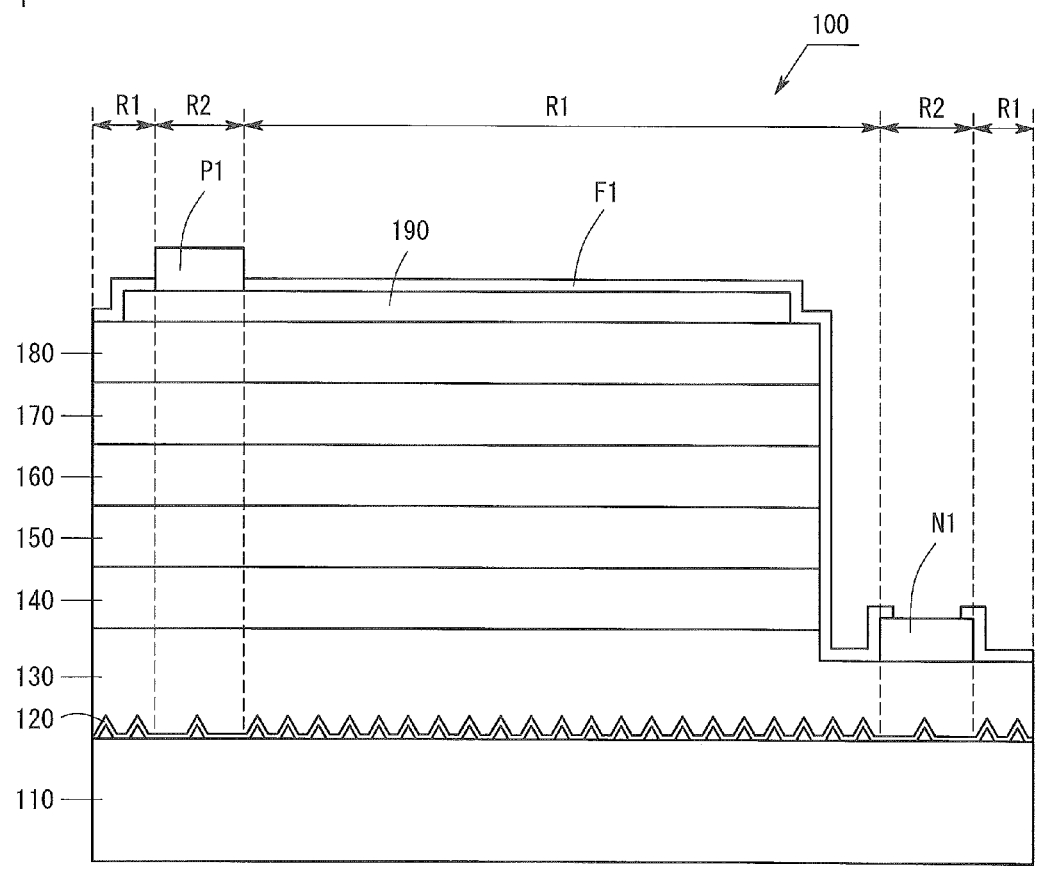
FIG. 1 schematically shows the structure of a light-emitting device of a first embodiment.

Specific embodiments of the present invention will next be described with reference to the drawings by taking, as an example, the case where a semiconductor light-emitting device is produced. However, the present invention is not limited to these embodiments. In the below-described semiconductor light-emitting device, the layered structure of each layer or the structure of each electrode are shown for an exemplary purpose. Needless to say, the layered structure may differ from that described below in the embodiments. The thickness of each layer which is schematically shown in the drawings does not correspond to its actual value. For example, the size of a pit shown hereinbelow is larger than its actual size.

First Embodiment

1. Semiconductor Light-Emitting Device

FIG. 1 schematically shows the structure of a light-emitting device 100 of the first embodiment. The light-emitting device 100 is a face-up type semiconductor light-emitting device. The light-emitting device 100 includes a plurality of Group III nitride semiconductor layers.

As shown in FIG. 1, the light-emitting device 100 includes a substrate 110, a low-temperature buffer layer 120, an n-type contact layer 130, an n-type ESD layer 140, an n-type SL layer 150, a light-emitting layer 160, a p-type cladding layer 170, a p-type contact layer 180, a transparent electrode 190, an n-pad electrode N1, a p-pad electrode P1, and a passivation film F1.

On the main surface of the substrate 110 are formed the respective semiconductor layers; i.e., the low-temperature buffer layer 120, the n-type contact layer 130, the n-type ESD layer 140, the n-type SL layer 150, the light-emitting layer 160, the p-type cladding layer 170, and the p-type contact layer 180 in this order. The n-pad electrode N1 is formed on the n-type contact layer 130. The p-pad electrode 91 is formed on the transparent electrode 190.

The substrate 110 serves as a growth substrate for forming, on the main surface thereof, the aforementioned semiconductor layers through epitaxy. The main surface of the substrate 110 is embossed. The substrate 110 is formed of, for example, sapphire. The substrate 110 may be formed of, instead of sapphire, a material such as SiC, ZnO, or Si. No particular limitation is imposed on the substrate 110, so long as it is a heterogeneous substrate having a chemical composition different from that of a Group III nitride semiconductor layer to be grown thereon.

The low-temperature buffer layer 120 is provided for transferring the crystallinity of the substrate 110 to a layer formed above the buffer layer 120. Therefore, the low-temperature buffer layer 120 is formed on the main surface of the substrate 110. The material of the low-temperature buffer layer 120 is, for example, AlN.

The n-type contact layer 130 is provided for achieving ohmic contact with the n-pad electrode N1. The n-type contact layer 130 is formed on the low-temperature buffer layer 120. The n-type contact layer 130 is located below the n-pad electrode N1, The n-type contact layer 130 is formed of n-type GaN and has an Si concentration of $1 \times 10^{18}/cm^3$ or more. The n-type contact layer 130 may be formed of a plurality of layers having different carrier concentrations for the purpose of improving the ohmic contact between the n-type contact layer 130 and the n-pad electrode N1. The n-type contact layer 130 has a thickness of, for example, 4 μm. Needless to say, the thickness of the n-type contact layer 130 is not limited thereto.

The n-type ESD layer 140 is provided for improving electrostatic breakdown voltage; i.e., for preventing electrostatic breakdown of each semiconductor layer. The n-type ESD layer 140 is formed on the n-type contact layer 130. The n-type ESD layer 140 has a semiconductor layered structure including a non-doped i-GaN layer and an n-type GaN layer. The n-type ESD layer 140 has a thickness of, for example, 300 nm.

The n-type SL layer 150 serves as a strain relaxation layer for relaxing stress applied to the light-emitting layer 160. Specifically, the n-type SL layer 150 is an n-type superlattice layer having a superlattice structure. The n-type SL layer 150 is formed on the n-type ESD layer 140. The n-type SL layer 150 is formed through repeated depositing of layer units each including an InGaN layer and an n-type GaN layer. The number of the layer units falls within a range of 10 to 20, but may fall outside the range.

The light-emitting layer 160 emits light through recombination of electrons and holes. The light-emitting layer 160 is formed on the n-type SL layer 150. The light-emitting layer 160 is formed through repeated depositing of layer units each including a barrier layer and a well layer. That is, the light-emitting layer 160 has a multiple quantum well structure (MQW structure) including the repeatedly deposited layer units. The number of the layer units is, for example, 5. Needless to say, the number of the layer units may be another value. The barrier layer may be, for example, a GaN layer or an AlGaN layer, and the well layer may be, for example, an InGaN layer. A cap layer may be provided for protecting the well layer from heat.

The barrier layer has a thickness of 10 Å to 100 Å, and the well layer has a thickness of 10 Å to 50 Å. Such a value is only an example, and thus the thickness of each layer may fall outside the above range. The overall thickness of the light-emitting layer 160 falls within a range of 500 nm to 700 nm. The light-emitting layer 160 does not necessarily have a multiple quantum well structure.

The p-type cladding layer 170 is formed on the light-emitting layer 160. The p-type cladding layer 170 is formed through, for example, repeated depositing of a p-type InGaN layer and a p-type AlGaN layer. The number of depositing cycles is, for example, 12. Needless to say, the number of depositing cycles may be another value.

The p-type contact layer 180 is formed on the p-type cladding layer 170. The p-type contact layer 180 is provided for achieving ohmic contact with the transparent electrode 190. The p-type contact layer 180 has a thickness of, for example, 80 nm. The p-type contact layer 180 is doped with Mg at a concentration of $1 \times 10^{19}/cm^3$ to $1 \times 10^{22}/cm^3$.

The transparent electrode 190 is formed on the p-type contact layer 180. The transparent electrode 190 is in ohmic contact with the p-type contact layer 180. The material of the transparent electrode 190 is, for example, ITO. The transparent electrode 190 may be formed of, instead of ITO, a transparent, electrically conductive oxide such as ICO, IZO, ZnO, $TiO_2$, $NbTiO_2$, or $TaTiO_2$.

The p-pad electrode P1 is provided for achieving electrical conduction to an external electrode. The p-pad electrode P1 is formed on the transparent electrode 190. The p-pad electrode P1 is formed by depositing, on the transparent electrode 190, a V layer and an Al layer in this order. Alternatively, the p-pad electrode P1 may be formed by sequentially depositing a Ti layer and an Al layer on the transparent electrode 190. Needless to say, the layer structure of the p-pad electrode P1 is not limited thereto.

The n-pad electrode N1 is provided for achieving electrical conduction to an external electrode. The n-pad electrode N1 is formed on the n-type contact layer 130. The n-pad electrode N1 is in ohmic contact with the n-type contact layer 130. The n-pad electrode N1 is formed by depositing, on the n-type contact layer 130, a V layer and an Al layer in this order. Alternatively, the n-pad electrode N1 may be formed by sequentially depositing a Ti layer and an Al layer on the n-type contact layer 130. Needless to say, the layer structure of the n-pad electrode N1 is not limited thereto.

The passivation film F1 covers side surfaces of the n-type contact layer 130, the n-type ESD layer 140, the n-type SL layer 150, the light-emitting layer 160, the p-type cladding layer 170, the p-type contact layer 180, and the transparent electrode 190, and also covers a portion of the p-pad electrode P1 and a portion of the n-pad electrode N1, That is, the remaining portion of the p-pad electrode P1 and the remaining portion of the n-pad electrode N1 are exposed without being covered with the passivation film S1. The material of the passivation film F1 is, for example, $SiO_2$.

2. Substrate 2-1. First Region R1 and Second Region R2

Figure 2:
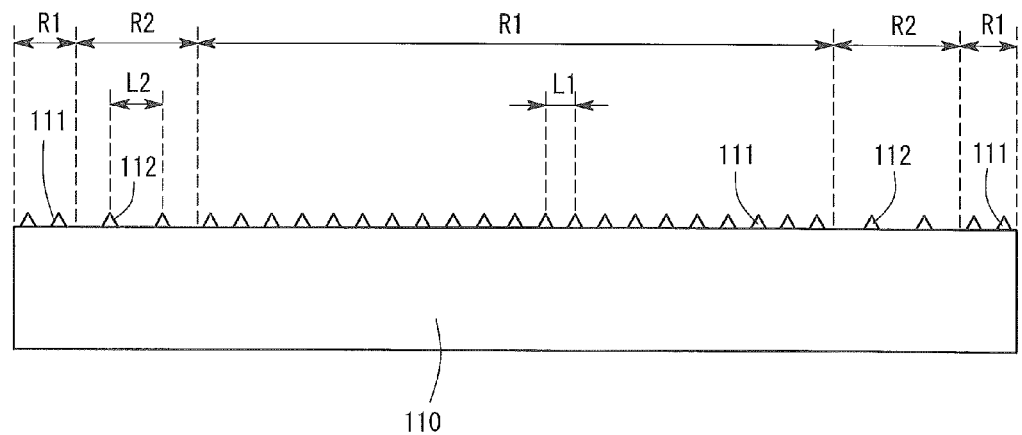
FIG. 2 shows an embossed substrate of the light-emitting device of the first embodiment (part 1)

FIG. 2 shows the substrate 110 of the light-emitting device 100 of the first embodiment. As shown in FIG. 2, the substrate 110 has a first region R1 and second regions R2. Protrusions 111 are formed in the first region R1, and protrusions 112 are formed in each of the second regions R2. The protrusions 112 have the same shape as the protrusions 111. For example, each of these protrusions has a hexagonal pyramidal shape. However, the protrusions 111 may have a shape different from that of the protrusions 112. In the first region R1, protrusions 111 are arranged at a relatively high density. Meanwhile, in each second region R2, protrusions 112 are arranged at a relatively low density. That is, the density of the protrusions 112 in the second region R2 is lower than that of the protrusions 111 in the first region R1.

2-2. Pitch

In the first region R1, adjacent protrusions 111 are arranged at a pitch L1. In each second region R2, adjacent protrusions 112 are arranged at a pitch L2. The pitch L2 in the second region R2 is larger than the pitch L1 in the first region R1.

The pitch L1 between the protrusions 111 in the first region R1 and the pitch L2 between the protrusions 112 in the second region R2 satisfy the following relation.

$$L2 = a \times L1 \text{ (wherein } 1.1 \leq a \leq 3\text{)} \tag{1}$$

When L1 and L2 satisfy the relation (1), emission efficiency can be improved, and an increase in driving voltage can be suppressed. The pitch L1 is 3.5 μm or less.

3. Positional Relationship Between Pad Electrode and Second Region R2

Each of the p-pad electrode P1 and the n-pad electrode N1 is a non-translucent electrode. In the first embodiment, a characteristic feature resides in that the pitch between protrusions in a projection area of the non-translucent electrode as viewed through the main surface of the substrate 110 is larger than the pitch between protrusions in a region other than the projection area.

Figure 3:
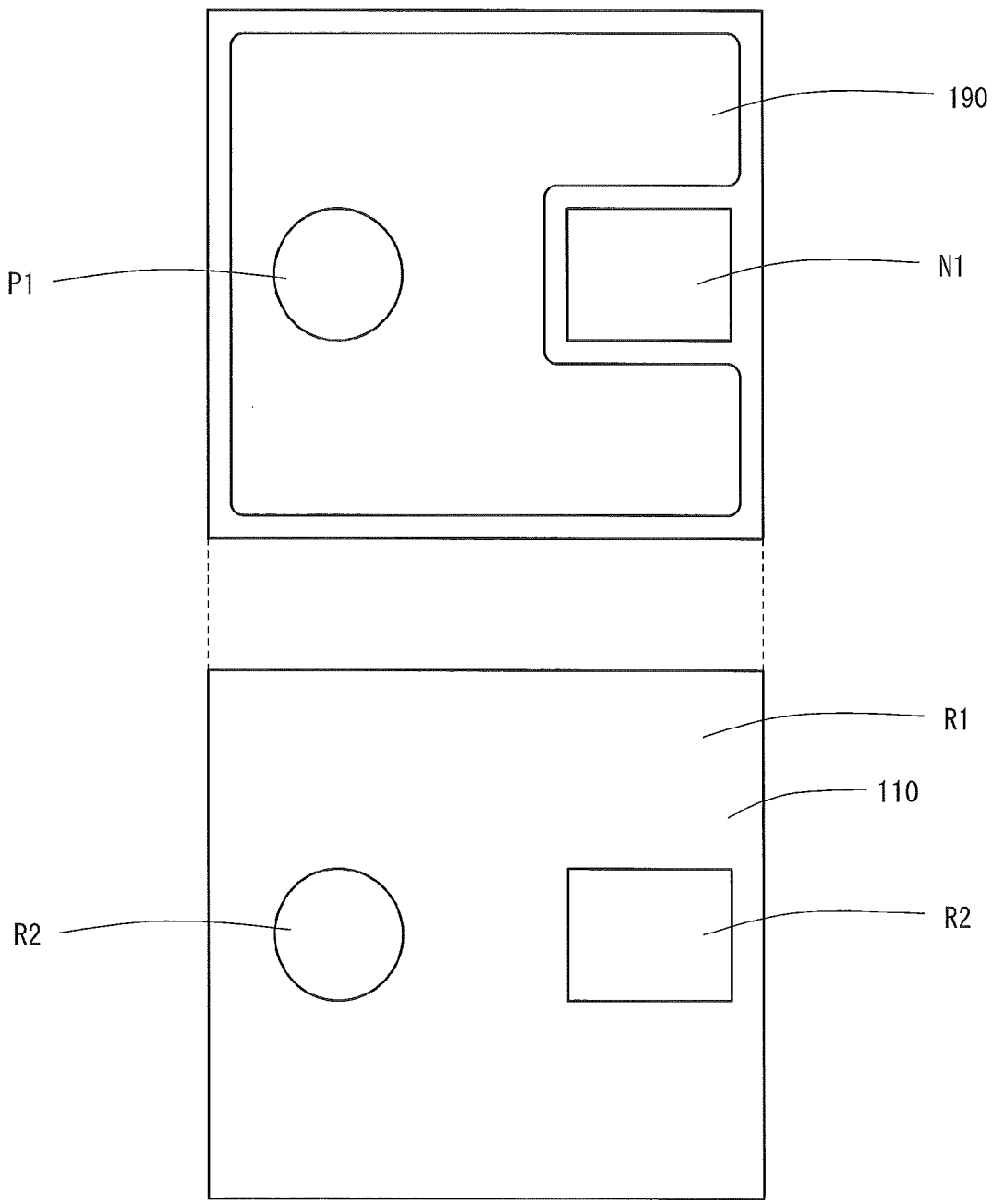
FIG. 3 schematically shows the positional relationship between pad electrodes and second regions in the light-emitting device of the first embodiment.

FIG. 3 shows the positions and shapes of the p-pad electrode P1 and the n-pad electrode N1 of the first embodiment, and the positional relationship between the first region R1 and the second regions R2 of the substrate 110. As shown in FIG. 3, the positions and shapes of the second regions R2 of the substrate 110 correspond to those of the p-pad electrode P1 and the n-pad electrode N1. That is, the second regions R2 correspond to projection areas of the p-pad electrode P1 and the n-pad electrode N1 as viewed through the main surface of the substrate 110.

Meanwhile, as shown in FIG. 3, the first region R1 of the substrate 110 corresponds to a region in which neither the p-pad electrode P1 nor the n-pad electrode N1 is formed. That is, the first region R1 corresponds to a projection area, as viewed through the main surface of the substrate 110, of the region in which neither the p-pad electrode P1 nor the n-pad electrode N1 is formed.

Figure 4:
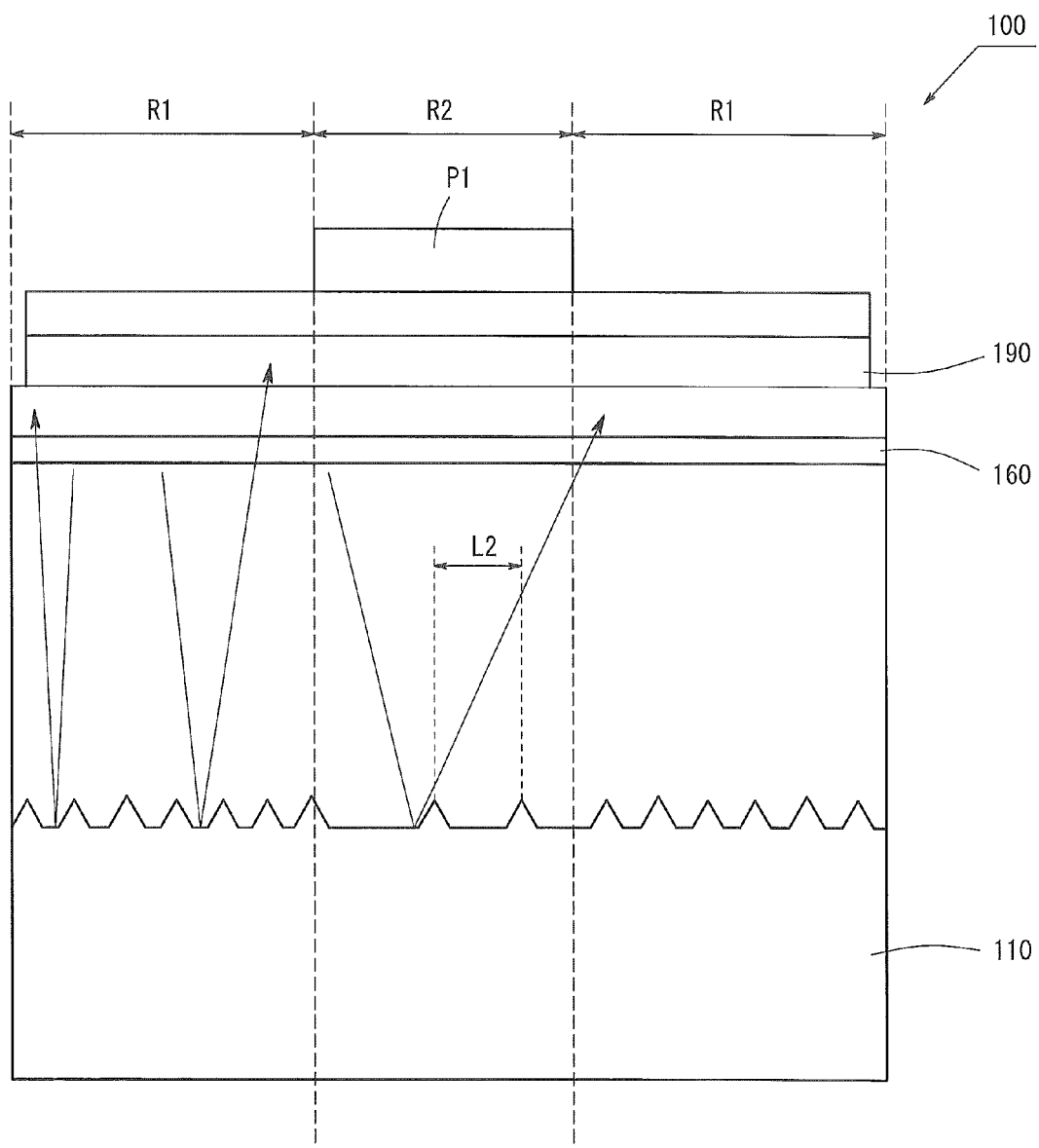
FIG. 4 shows the difference in reflection angle of light between a first region and a second region, the light being reflected on the main surface of the substrate of the light-emitting device of the first embodiment.

As shown in FIG. 4, in the first region R1, light emitted from the light-emitting layer 160 toward the substrate 110 is reflected at the interface between the substrate 110 and the semiconductor layer, and the reflected light exits to the outside through the transparent electrode 190. Light emitted from the light-emitting layer 160 toward the second region R2 of the substrate 110 is reflected at the interface between the substrate 110 and the semiconductor layer, and the reflected light exits to the outside through the transparent electrode 190. As described hereinbelow in experiments in the second embodiment, light distribution angle is large in the second region R2, in which the pitch L2 between the protrusions 112 is relatively large. Therefore, light reflected in the second region R2 is barely reflected by the p-pad electrode P1 or the n-pad electrode N1, and exits to the outside through the transparent electrode 190.

A portion of the light-emitting layer 160 above the second region R2 exhibits a crystallinity lower than that of a portion of the light-emitting layer 160 above the first region R1. Therefore, the amount of light emitted from the portion of the light-emitting layer 160 above the second region R2 is smaller than that of light emitted from the portion of the light-emitting layer 160 above the first region R1. That is, the amount of light absorbed in the non-translucent electrode is reduced, as compared with the case of conventional light-emitting devices.

4. Relationship Between Pitch and Threading Dislocation Density

Figure 5:
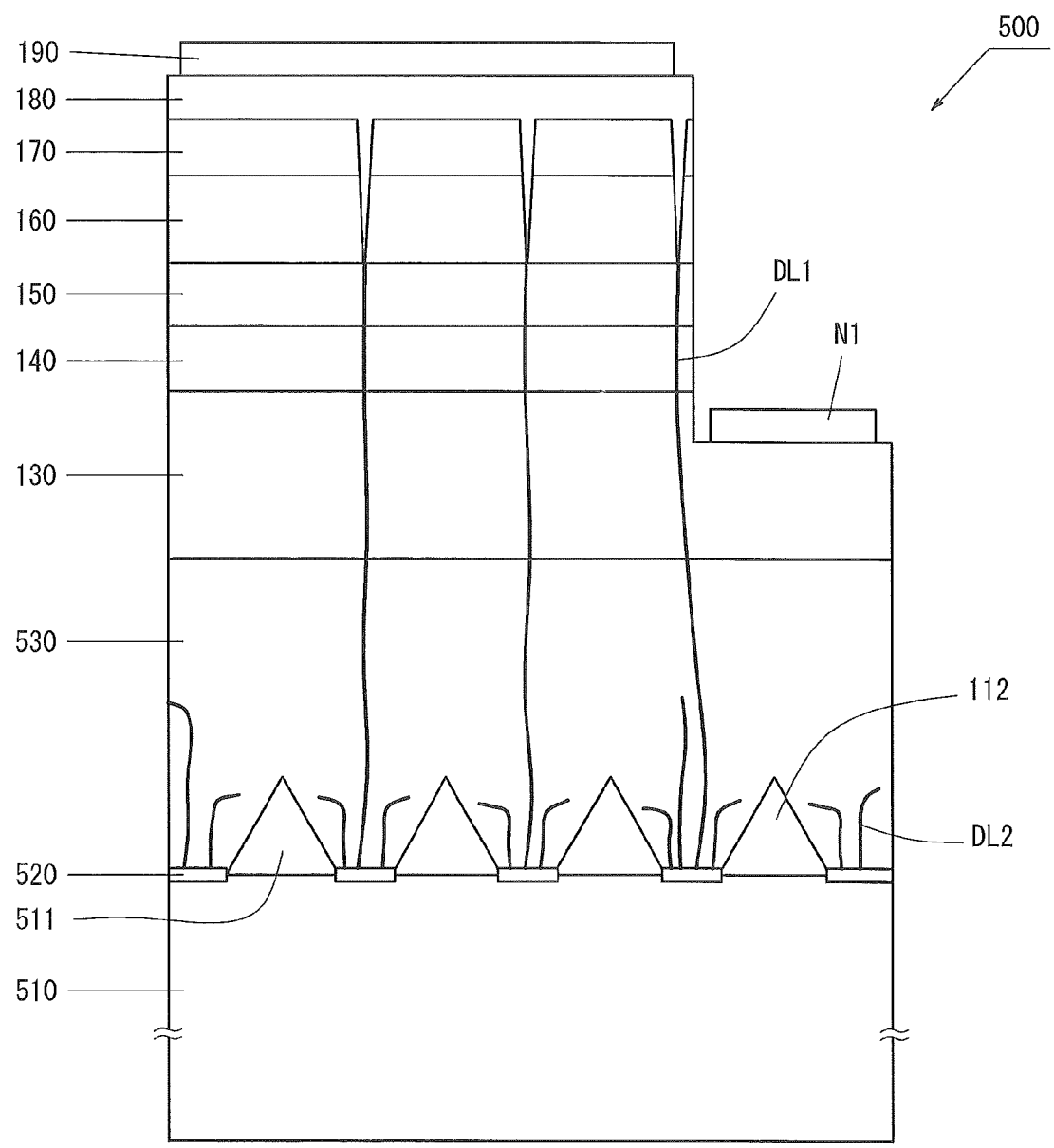
FIG. 5 schematically shows threading dislocations propagating from an embossed substrate of a conventional light-emitting device.

FIG. 5 schematically shows the relationship between protrusions of a substrate and extension of dislocations. Thus, it should be noted that a light-emitting device 500 shown in FIG. 5 differs from the light-emitting device 100 of the first embodiment. The light-emitting device 500 includes a substrate 510 having thereon numerous protrusions 511. Therefore, some dislocations DL1 grow upwardly from the substrate 510, but the remaining dislocations DL2 grow in an oblique direction and are eventually extinguished. That is, the dislocations DL2 extending in an oblique direction are not transferred to an upper semiconductor crystal layer. Therefore, the upper semiconductor layer exhibits a dislocation density lower than that of a semiconductor layer nearer to the substrate 510; i.e., the upper semiconductor layer exhibits good crystallinity.

Similar effects are expected in the first region R1 of the substrate 110 according to the first embodiment. Meanwhile, since the number of the protrusions 112 is relatively small in the second region R2 of the substrate 110 according to the first embodiment, the effect of bending the extension direction of threading dislocations is reduced in the second region R2. That is, a portion of the semiconductor layer above the first region R1 exhibits low threading dislocation density; i.e., a portion of the semiconductor layer above the second region R2 exhibits a threading dislocation density higher than that of a portion of the semiconductor layer above the first region R1.

5. Relationship Between Threading Dislocation Density and Driving Voltage Vf As described above, a semiconductor layer having a large number of threading dislocations exhibits lowered crystallinity. This phenomenon may cause deterioration of the emission efficiency of a light-emitting device. Meanwhile, the presence of threading dislocations can suppress an increase in driving voltage Vf. The distance between a p-type semiconductor layer and an n-type semiconductor layer is smaller in a portion having threading dislocations than in a portion having no threading dislocations.

Figure 6:
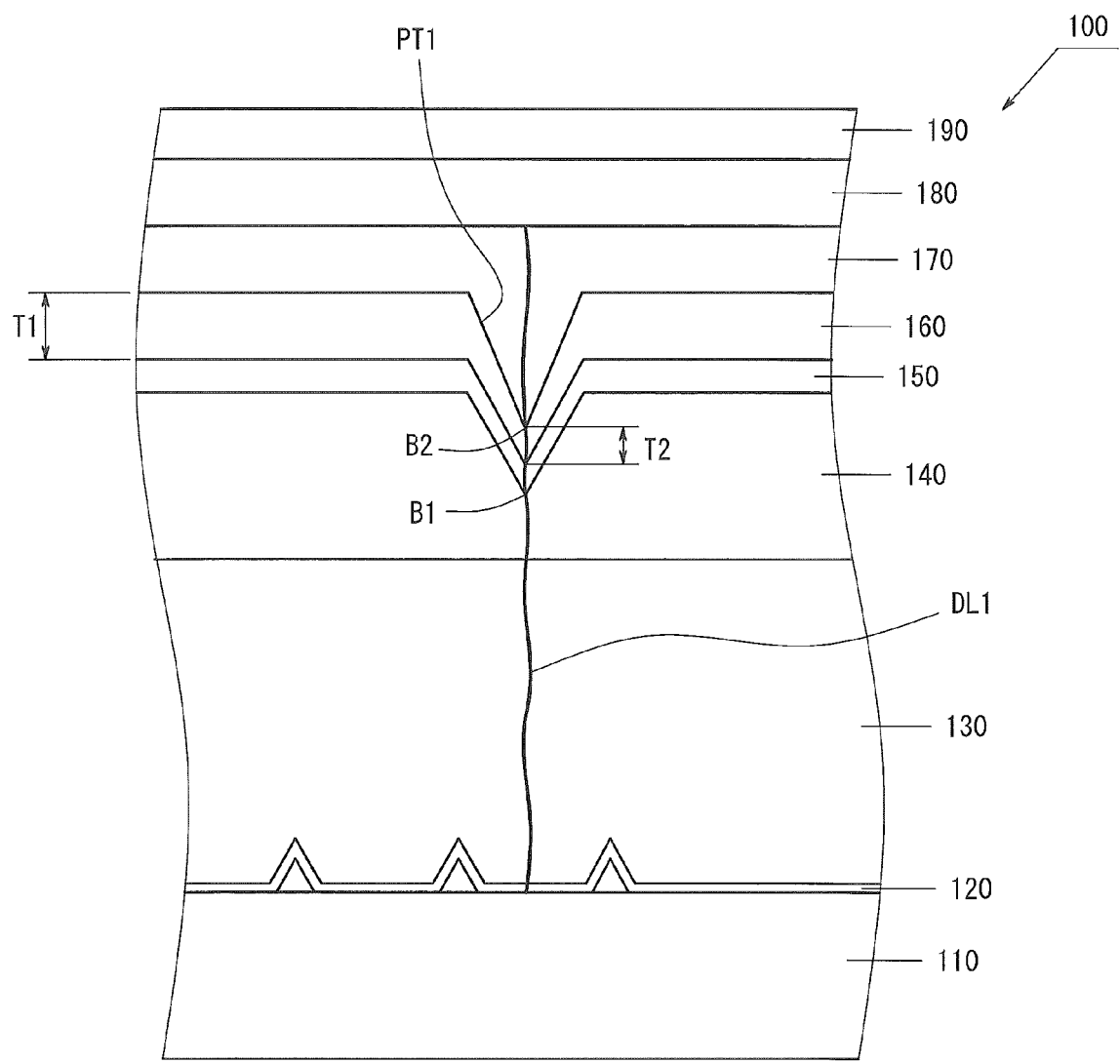
FIG. 6 cross-sectionally shows a threading dislocation and a pit in the light-emitting device of the first embodiment.

FIG. 6 schematically shows a threading dislocation DL1 and a pit PT1 in the semiconductor layers of the light-emitting device 100 of the first embodiment. As shown in FIG. 6, the threading dislocation DL1 extends upwardly from the substrate 110. The pit PT1 is formed to extend from the n-type ESD layer 140 to the light-emitting layer 160.

The pit PT1 is a hexagonal pyramidal or conical dent. The bottom B1 of the pit PT1 is present in the interior of the n-type ESD layer 140. This indicates that formation of the pit PT1 begins at the bottom B1 during growth of the n-type ESD layer 140. A portion of the n-type ESD layer 140 enters the pit PT1. Also, the corresponding portions of the n-type SL layer 150 and the light-emitting layer 160 enter the pit PT1.

Also, a portion of the p-type cladding layer 170 enters and fills the pit PT1. The bottom B2 of the p-type cladding layer 170 is located near to the n-type SL layer 150. As shown in FIG. 6, a portion of the light-emitting layer 160 where the pit PT1 is not present has a thickness T1. A portion of the light-emitting layer 160 where the pit PT1 is present has a thickness T2. In this case, the thickness T2 of the light-emitting layer 160 at the portion having the pit PT1 is smaller than the thickness T1. That is, the distance between the n-type semiconductor layer and the p-type semiconductor layer is smaller at the portion having the pit PT1. Therefore, the portion having the pit PT1 has an electric field intensity higher than that of another portion. That is, electric current is likely to flow at the PT1 portion between the n-type semiconductor layer and the p-type semiconductor layer.

6. Effects of First Region R1 and Second Region R2

Threading dislocation density is low in the first region R1; i.e., a region in which protrusions are arranged at high density. Meanwhile, threading dislocation density is high in the second region R2; i.e., a region in which protrusions are arranged at low density. Thus, in the first embodiment, threading dislocation density is adjusted to become high locally in the second region R2; i.e., a projection area of the pad electrode (P1, N1) as viewed through the main surface of the substrate 110.

Therefore, in the light-emitting device 100 of the first embodiment, threading dislocation density can be reduced to a relatively low level in the entire light-emitting surface, while an increase in driving voltage Vf can be suppressed. Thus, the light-emitting device 110 realizes high emission efficiency and low driving voltage Vf.

7. Production Method for Semiconductor Light-Emitting Device

Now will be described a method for producing the light-emitting device 100 of the first embodiment. The aforementioned respective semiconductor layers are epitaxially grown through metal-organic chemical vapor deposition (MOCVD). The carrier gas employed in the method is hydrogen ($H_2$), nitrogen ($N_2$), or a gas mixture of hydrogen and nitrogen ($H_2+N_2$). Ammonia gas ($NH_3$) is employed as a nitrogen source. Trimethylgallium ($Ga(CH_3)_3$) is employed as a Ga source. Trimethylindium ($In(CH_3)_3$) is employed as an In source. Trimethylaluminum ($Al(CH_3)_3$) is employed as an Al source. Silane (SiH$_4$) is employed as an n-type dopant gas. Cyclopentadienylmagnesium (Mg(C$_5$H$_5$)$_2$) is employed as a p-type dopant gas.

7-1. Step of Providing Embossed Substrate

Firstly, there is provided the substrate 110 having an embossed main surface. The substrate 110 is provided through, for example, laser processing of the main surface of a sapphire substrate or the like. For example, the substrate 110 having the first region R1 and the second region R2 is formed by varying laser scanning conditions. Needless to say, the embossed substrate may be formed through another process.

7-2. Step of Forming n-Type Contact Layer

The low-temperature buffer layer 120 is formed on the main surface of the substrate 110. Thereafter, the n-type contact layer 130 is formed on the buffer layer 120. In this step, the substrate temperature is maintained at 1,080° C. to 1,140° C. The Si concentration of the n-type contact layer 130 is adjusted to 1×10$^{18}$/cm$^3$ or more.

7-3. Step of Forming Electrostatic Breakdown Prevention Layer

Subsequently, the n-type ESD layer 140 is formed on the n-type contact layer 130. After formation of an i-GaN layer by stopping supply of silane (SiH$_4$), supply of silane (SiH$_4$) is resumed to thereby form an n-type GaN layer. In this step, the substrate temperature is maintained at 770° C. to 970° C. In this step, the pit PT1 is formed as shown in FIG. 6. The pit PT1 is grown in association with growth of the subsequent semiconductor layers. Thus, while the pit PT1 is formed, the n-type ESD layer 140 is formed.

7-4. Step of forming n-type superlattice layer

Next, the n-type SL layer 150 is formed. Firstly, an InGaN layer is formed on the n-type ESD layer 140. Subsequently, an n-type GaN layer is formed on the InGaN layer. Then, layer units each including the InGaN layer and the n-type GaN layer are repeatedly deposited.

7-5. Step of Forming Light-Emitting Layer

Next, the light-emitting layer 160 is formed. For formation of the light-emitting layer 160, layer units each including a barrier layer and a well layer which are deposited in this order are repeatedly deposited. This step is carried out repeatedly. During growth of the well layer, the substrate temperature is maintained at 750° C. to 870° C. The substrate temperature during growth of the barrier layer is higher than the temperature for growth of the well layer.

The overall thickness of the light-emitting layer 160 is adjusted to fall within a range of 500 nm to 700 nm. The light-emitting layer 160 is formed so that the pit size D at the top surface of the light-emitting layer 160 falls within a range of 120 nm to 250 nm. The pit size D may be controlled by regulating the growth temperature.

7-6. Step of Forming p-Type Superlattice Layer

Subsequently, the p-type cladding layer 170 is formed. In this step, a p-type InGaN layer and a p-type AlGaN layer are repeatedly deposited.

7-7. Step of Forming p-Type Contact Layer

Next, the p-type contact layer 180 is formed. The substrate temperature is maintained at 920° C. to 1,080° C. Thus, as shown in FIG. 6, the respective semiconductor layers are deposited on the substrate 110. The pit PT1 is formed so as to extend from the n-type ESD layer 140 to the p-type cladding layer 170.

7-8. Step of Forming Electrode

Subsequently, the p-pad electrode P1 is formed on the p-type contact layer 180. Then, laser processing or etching is carried out from the top surface of the p-type contact layer 180, to thereby expose a portion of the n-type contact layer 130 through the corresponding portions of the semiconductor layers. The n-pad electrode N1 is formed on the exposed portion of the n-type contact layer 130. The p-pad electrode P1 formation step may be preceded or followed by the n-pad electrode N1 formation step.

7-9. Step of Forming Insulation Film

The passivation film F1 is formed so as to cover, for example, side surfaces of the semiconductor layers and a portion of the p-pad electrode P1 and a portion of the n-pad electrode N1, The passivation film F1 is formed of, for example, SiO$_2$. Needless to say, the passivation film F1 may be formed of another transparent insulation film. Alternatively, the entirety of the light-emitting device 100 may be covered with the passivation film F1, followed by exposure of only a necessary portion.

7-10. Other Steps

In addition to the above-described steps, other steps (including a thermal treatment step) may be carried out. Thus, the light-emitting device 100 shown in FIG. 1 is produced.

8. Modifications 8-1. Second Region R2

In the first embodiment, the second regions R2 correspond to projection areas of the p-pad electrode P1 and the n-pad electrode N1 as viewed through the main surface of the substrate 110. However, the second regions R2 do not necessarily correspond completely to the projection areas. For example, the second regions R2 may be slightly larger in size than the projection areas of the p-pad electrode P1 and the n-pad electrode N1 as viewed through the main surface of the substrate 110. Alternatively, the second regions R2 may be slightly smaller in size than the projection areas of the p-pad electrode P1 and the n-pad electrode N1 as viewed through the main surface of the substrate 110.

As described above, a difference in size may be present between the second regions R2 and the projection areas of the p-pad electrode P1 and the n-pad electrode N1 as viewed through the main surface of the substrate 110. This difference in size preferably falls within a range of ±6 μm, more preferably a range of ±3 μm. In this case, the symbol "+" refers to the case where the second regions R2 are larger in size than the projection areas of the p-pad electrode P1 and the n-pad electrode N1 as viewed through the main surface of the substrate 110.

Figure 7:
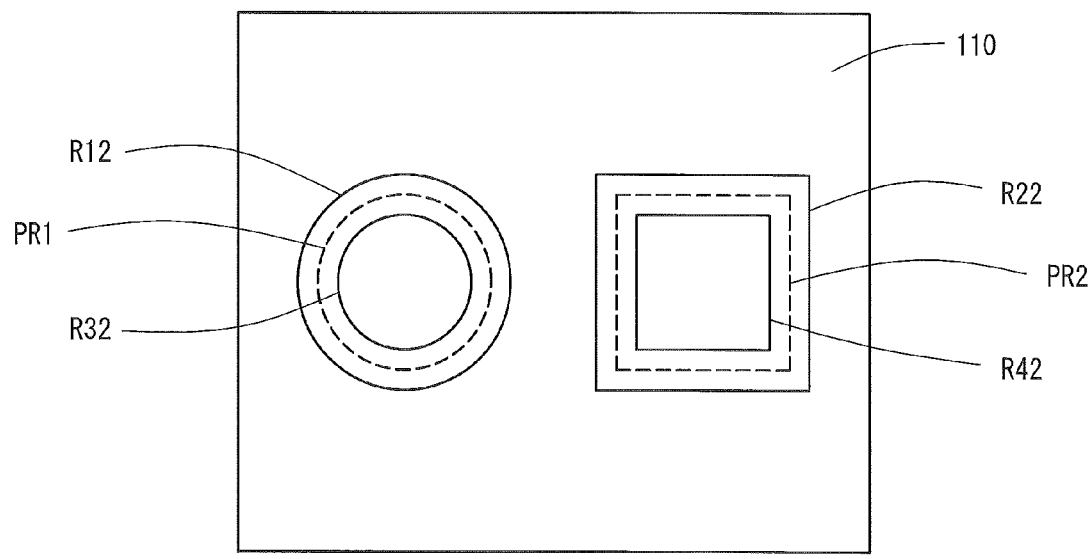
FIG. 7 shows a first region and a second region on a substrate of a light-emitting device according to a modification of the first embodiment (part 1)

FIG. 7 is a schematic representation showing the aforementioned relationship. FIG. 7 shows a projection area PR1 of the p-pad electrode P1 as viewed through the main surface of the substrate 110, and a projection area PR2 of the n-pad electrode N1 as viewed through the main surface of the substrate 110. FIG. 7 also shows a second region R12 having a size larger than that of the projection area PR1, and a second region R32 having a size smaller than that of the projection area PR1. FIG. 7 also shows a second region R22 having a size larger than that of the projection area PR2, and a second region R42 having a size smaller than that of the projection area PR2.

Figure 8:
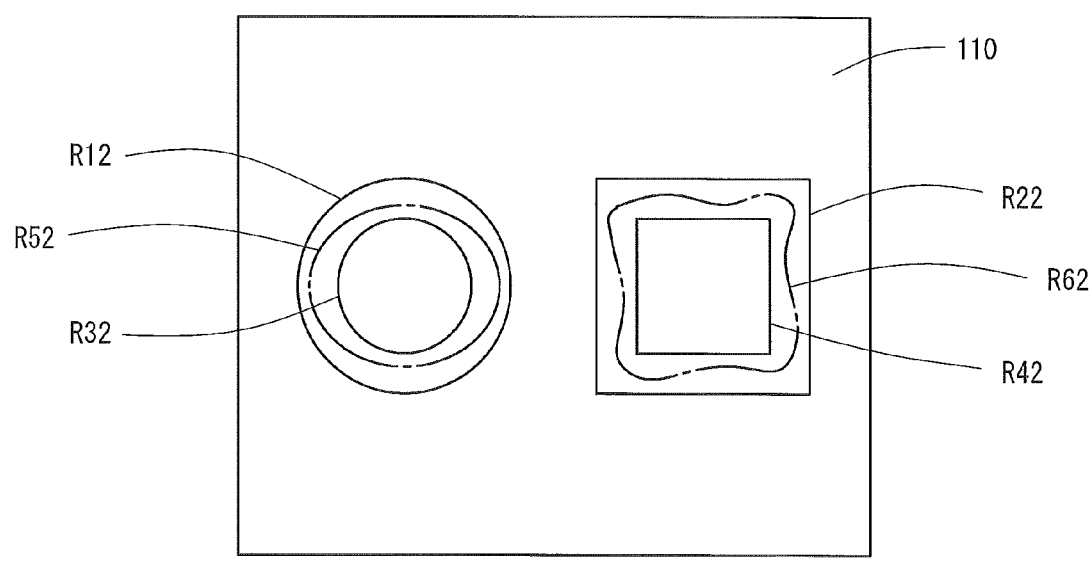
FIG. 8 shows a first region and a second region on a substrate of a light-emitting device according to another modification of the first embodiment (part 2)

As in the case of a second region R52 shown in FIG. 8, no particular limitation is imposed on the shape of the second region, so long as the perimeter thereof is present within a region defined by the region perimeters of the second regions R12 and R32. Similarly, as in the case of a second region R62 shown in FIG. 8, no particular limitation is imposed on the shape of the second region, so long as the perimeter thereof is present within a region defined by the region perimeters of the second regions R22 and R42.

That is, the second region has a perimeter being included within a region defined by a region perimeter located 6 μm or less outward from the perimeter of the projection area PR1 or PR2 of the non-translucent electrode as viewed through the main surface of the heterogeneous substrate, and also defined by a region perimeter located 6 μm or less inward from the perimeter of the projection area PR1 or PR2.

8-2. Pitch in Second Region R2

In the first embodiment, the pitch L1 is constant in the first region R1, and the pitch L2 is constant in the second region R2. However, the pitch L2 may be non-constant in the second region R2. For example, in the second region R2, protrusions located more distant from the boundary between the first region R1 and the second region R2 are arranged at a larger pitch; i.e., protrusions located nearer to the center of the second region R2 are arranged at a larger pitch.

8-3. Pad Electrode

In the first embodiment, the second regions R2 correspond to the projection areas PR1 and PR2 of the p-pad electrode P1 and the n-pad electrode N1 as viewed through the substrate 110. As shown in FIG. 1, the light-emitting layer 160 is present below the p-pad electrode P1, but is not present below the n-pad electrode N1. Therefore, light emitted from the light-emitting layer 160 to the substrate 110 is more likely to radiate toward the p-pad electrode P1 than toward the n-pad electrode N1. Thus, even when only the projection area PR1 of the p-pad electrode P1 is the second region R2, sufficient effects are expected to be obtained.

8-4. Combination

The above-described modifications may be employed in any combination.

9. Summary of First Embodiment

As described above in detail, the light-emitting device 100 of the first embodiment includes the substrate 110 having an embossed main surface. The substrate 110 has the first region R1 in which protrusions are arranged at a small pitch, and the second region R2 in which protrusions are arranged at a large pitch. The second region R2 is located in a projection area of the non-translucent electrode (e.g., pad electrode) as viewed through the main surface of the substrate 110. Therefore, threading dislocation density is relatively high in the second region R2. Thus, the semiconductor light-emitting device includes semiconductor layers having excellent crystallinity, and realizes suppression of an increase in driving voltage Vf.

The above-described embodiment is only an example. Therefore, needless to say, various modifications and variations may be made in the present invention without departing from the scope of the invention. The structure of the layered product is not necessarily limited to one shown in the drawings. For example, any layered structure may be selected, or any number of layer units may be determined for forming each layer. Crystal growth is not necessarily carried out through metal-organic chemical vapor deposition (MOCVD), and any other crystal growth method employing a carrier gas may be employed. That is, semiconductor layers may be formed through another epitaxial growth method such as liquid-phase epitaxy or molecular beam epitaxy.

Second Embodiment

The second embodiment will next be described. The light-emitting device 200 of the second embodiment is a semiconductor light-emitting device including dot electrodes which come into contact with a contact electrode, and wiring electrodes for connecting the dot electrodes to pad electrodes.

1. Semiconductor Light-Emitting Device

Figure 9:
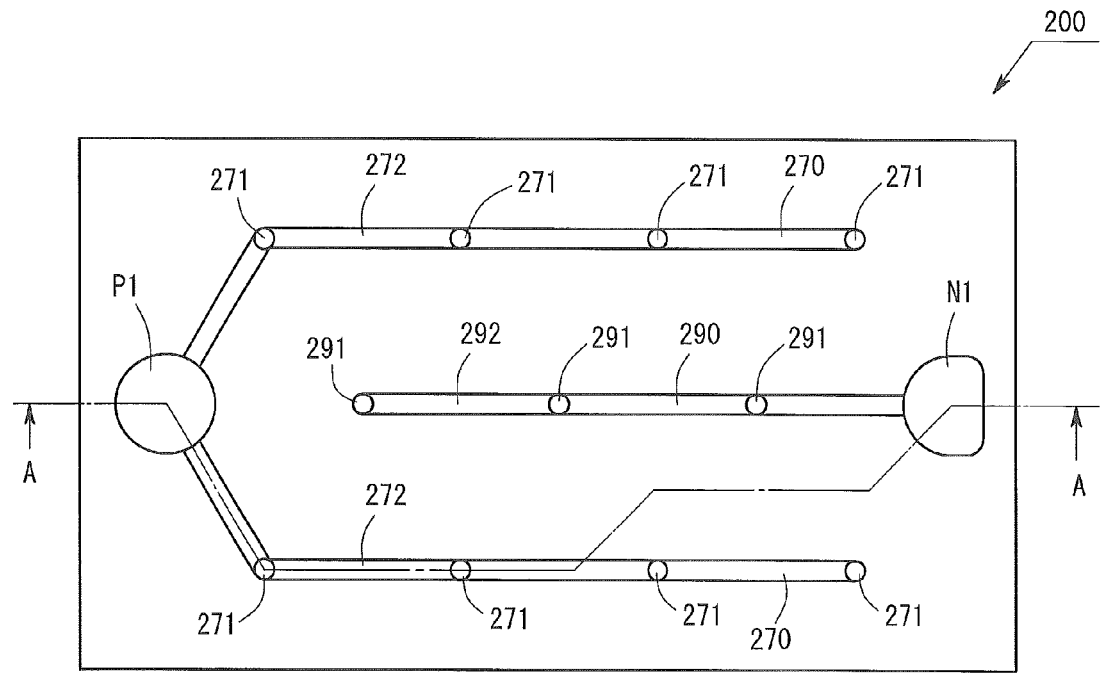
FIG. 9 is a plan view of the structure of a light-emitting device of a second embodiment (part 1)
Figure 10:
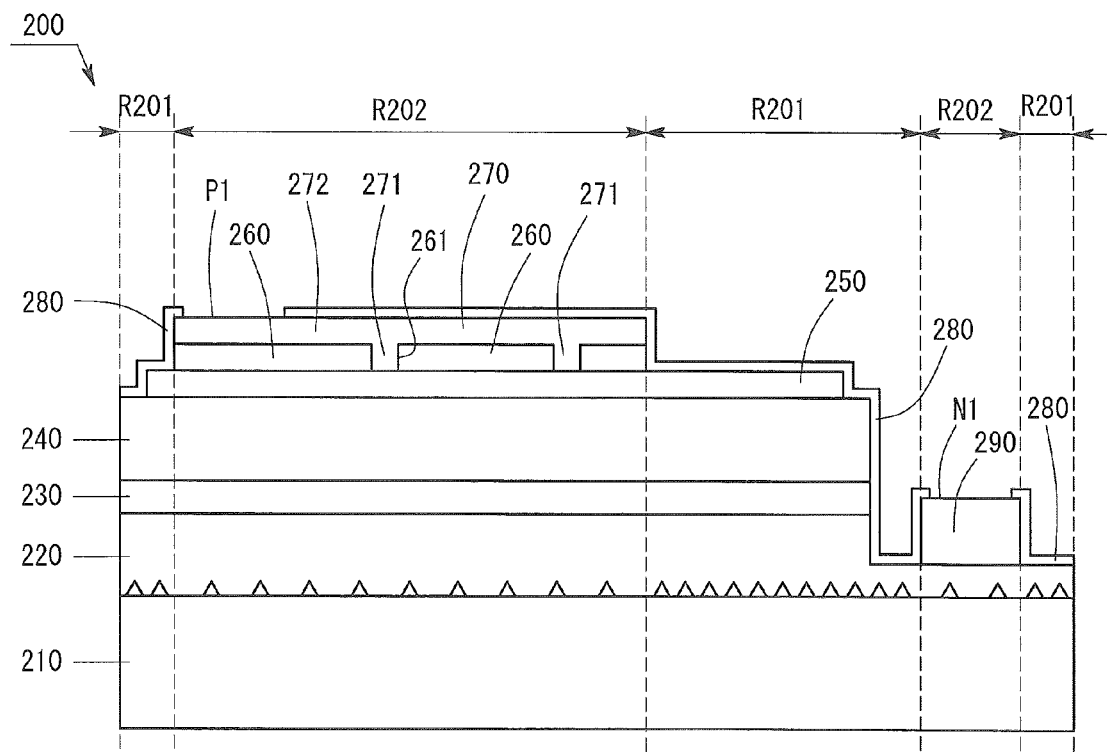
FIG. 10 is a cross-sectional view of the structure of the light-emitting device of the second embodiment.

FIG. 9 is a plan view of the light-emitting device 200 of the second embodiment. FIG. 10 is a cross-sectional view of the light-emitting device 200 taken along line A-A of FIG. 9. The light-emitting device 200 is a semiconductor light-emitting device including dot electrodes provided in a light-emitting surface, and wiring electrodes for connecting the dot electrodes to pad electrodes. In the light-emitting device 200, wiring electrodes 270 are formed so as to extend over an insulation layer 260. The light-emitting device 200 includes a substrate 210, an n-type layer 220, a light-emitting layer 230, a p-type layer 240, a transparent electrode 250, the insulation layer 260, the wiring electrodes 270, an insulation film 280, and a wiring electrode 290.

As shown in FIG. 9, in the light-emitting device 200, the p-side wiring electrodes 270 and the n-side wiring electrode 290 are pectinately arranged. Each of the p-side wiring electrodes 270 is in contact with the transparent electrode 250 at contact portions 271. The contact portions 271 also serve as dot electrodes which are electrically conducted to the transparent electrode 250. The contact portions 271 are distributed over the light-emitting surface. The n-side wiring electrode 290 is in contact with the n-type contact layer of the n-type layer 220 at contact portions 291. The wiring electrodes 270 and 290 are covered with the insulation film 280. However, a specific portion of each of the wiring electrodes 270 and 290 is exposed.

The wiring electrodes 270 are formed on the insulation layer 260. Each wiring electrode 270 has the contact portions 271 and a wiring portion 272. The contact portions 271 serve as wiring electrodes which are in contact with the transparent electrode 250. The contact portions 271 fill a plurality of holes 261 which are provided in the insulation layer 260 so as to be separated from one another. Each contact portion 271 is in contact with the transparent electrode 250 at the bottom of the corresponding hole 261. The wiring portion 272 is provided for electrically connecting the contact portions 271 to the p-pad electrode P1. Each wiring electrode 270 is formed by, for example, sequentially depositing a Cr layer, a Ti layer, and an Au layer on the p-type layer 240. Needless to say, the wiring electrode 270 may have another layer structure. However, the lowermost layer of the wiring electrode 270 is preferably formed of a metal material exhibiting good adhesion to $SiO_2$ or TiC. The same shall apply to the wiring electrode 290.

The material of the contact portions 271 may differ from that of the wiring portion 272. In such a case, the lowermost layer of each contact portion 271 is preferably formed of a metal material which can achieve ohmic contact with the transparent electrode 250. The lowermost layer of the wiring portion 272 is preferably formed of a metal material exhibiting good adhesion to $SiO_2$. The lowermost layer of each contact portion 291 is preferably formed of a metal material which can achieve ohmic contact with the n-type layer 220. The lowermost layer of the wiring portion 292 is preferably formed of a metal material exhibiting good adhesion to $SiO_2$.

2. Substrate

As shown in FIG. 10, the substrate 210 has an embossed main surface. Specifically, the main surface of the substrate 210 has thereon a first region R201 in which protrusions are arranged at a small pitch, and second regions R202 in which protrusions are arranged at a large pitch.

3. Positional Relationship Between Pad Electrode and Second Region

In the second embodiment, the non-translucent electrodes inhibit transmission of light emitted from the light-emitting layer 230 to the outside of the device in an axial direction. In the second embodiment, the non-translucent electrodes which inhibit transmission of light to the outside of the device corresponds to the p-pad electrode P1, the p-side contact portions 271, and the p-side wiring portions 272.

Figure 11:
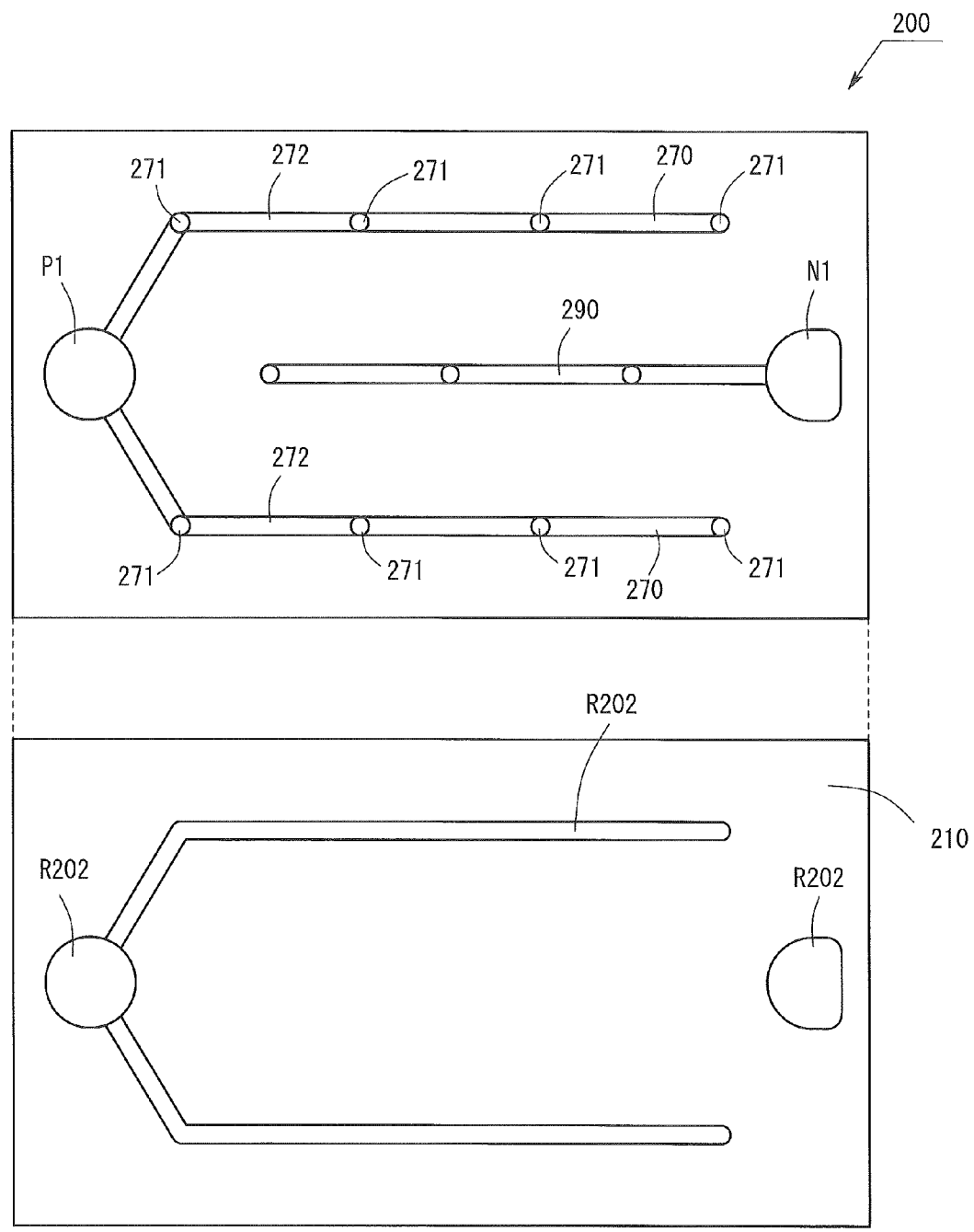
FIG. 11 schematically shows the positional relationship between pad electrodes, wiring electrodes, and second regions in the light-emitting device of the second embodiment.

Therefore, in the light-emitting device 200 of the second embodiment, as shown in FIG. 11, the second regions R202 correspond to projection areas of the p-pad electrode P1, the contact portions 271, and the wiring portions 272 as viewed through the main surface of the substrate 210. The pitch between protrusions in each second region R202 is larger than the pitch between protrusions in the first region R201.

4. Effects of First Region and Second Region

Also in the second embodiment, the first region R201 and the second regions R202 are provided. By virtue of the presence of the first region R201, the light-emitting layer 230 exhibits good crystallinity as a whole. Meanwhile, by virtue of the presence of the second regions R202, an increase in driving voltage Vf is suppressed.

Figure 12:
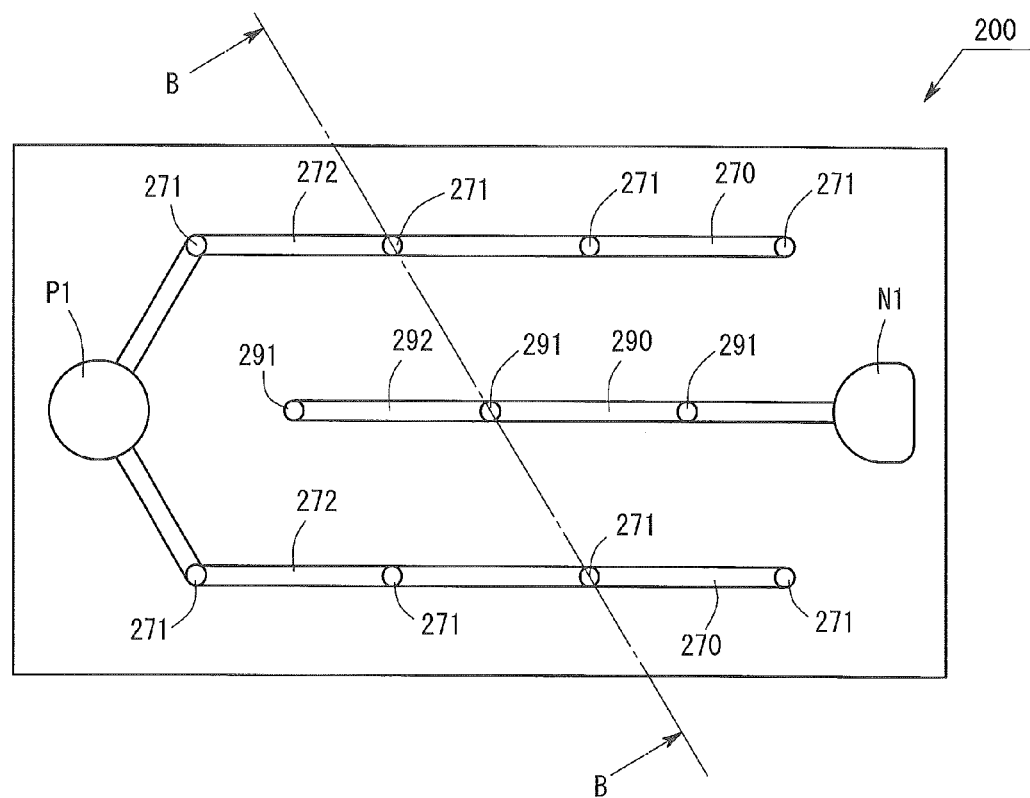
FIG. 12 is a plan view of the structure of the light-emitting device of the second embodiment (part 2)
Figure 13:
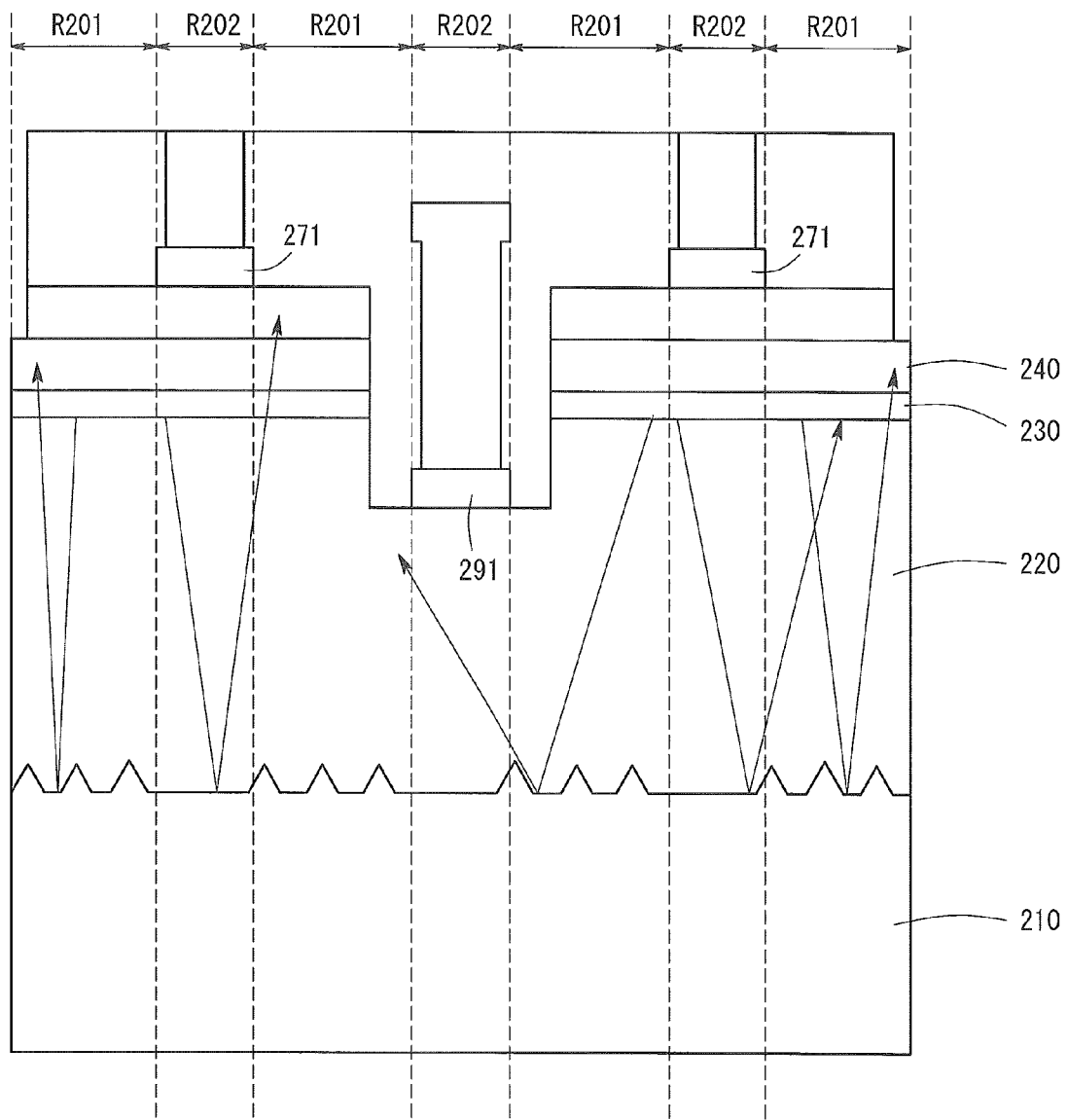
FIG. 13 shows the difference in reflection angle of light between a first region and a second region, the light being reflected on the main surface of the substrate of the light-emitting device of the second embodiment.

FIG. 12 is another plan view of the light-emitting device 200. FIG. 13 is a cross-sectional view of the light-emitting device 200 taken along line B-B of FIG. 12. As shown in FIG. 13, light is reflected at a large angle in the second regions R202.

5. Experiments 5-1. Samples

Figure 14:
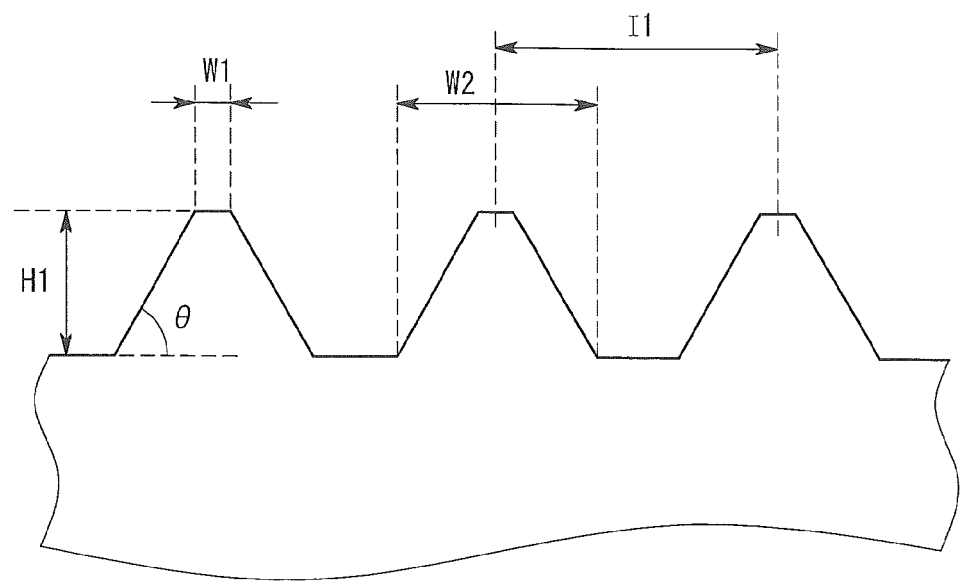
FIG. 14 shows the embossed substrate of the light-emitting device of the first embodiment (part 2)

Now will be described experiments for examining how properties (e.g., driving voltage Vf) change when the pitch between protrusions are varied. In the experiments, samples were prepared so that the pitch was adjusted to 3.5 μm, 4.0 μm, or 5.0 μm. Table 1 shows, for example, the sizes of protrusions corresponding to these pitches. As shown in FIG. 14, reference numeral I1 denotes a pitch, W1 a top size, W2 a protrusion size, H1 a dot height, and θ an inclination angle. In each of the experimental samples, the entirety of the device was modified in terms of, for example, the pitch between protrusions. Therefore, unlike the case of the light-emitting device 200 of the second embodiment, both the first region R201 and the second region R202 are not provided in a single device.

TABLE 1

| I1 | Pitch (μm) | 3.5 | 4.0 | 5.0 |
| W1 | Top size (μm) | 0.459 | 0.417 | 0.384 |
| W2 | Protrusion size (μm) | 3.024 | 2.953 | 3.088 |
| H1 | Dot height (μm) | 1.547 | 1.5 | 1.547 |
| θ | Inclination angle (°) | 50.6 | 49.9 | 49.0 |

The top size W1 is preferably 0 μm to 1 μm. The protrusion size W2 is preferably 2 μm to 10 μm. The dot height H1 is preferably 1 μm to 5 μm. The inclination angle θ is preferably 40° to 60°.

5-2. Light Distribution

Figure 15:
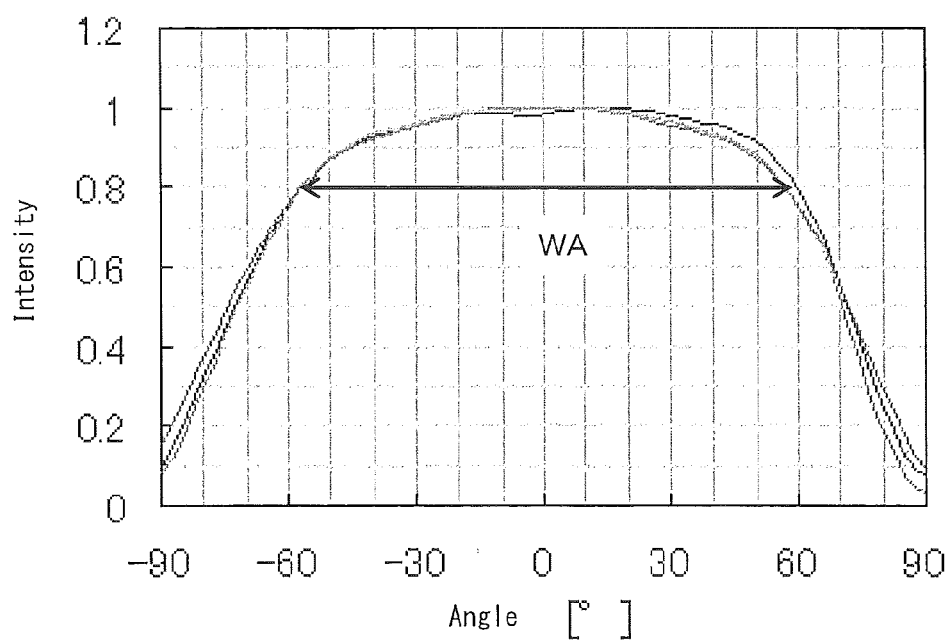
FIG. 15 is a graph showing light distribution in experiments.

FIG. 15 is a graph showing the dependency of the emission intensity of a light-emitting device on the angle of light distribution. The range WA shown by an arrow in FIG. 15 corresponds to a range in which the emission intensity of the light-emitting device is 4/5 or more with respect to the maximum emission intensity thereof (taken as 1). Hereinafter, this range will be referred to as "light distribution 2θ 4/5." As shown in FIG. 15, the light distribution 2θ 4/5 is about 115°. The larger the light distribution 2θ 4/5, the larger the angle at which light is reflected by the embossed surface of the substrate.

Figure 16:
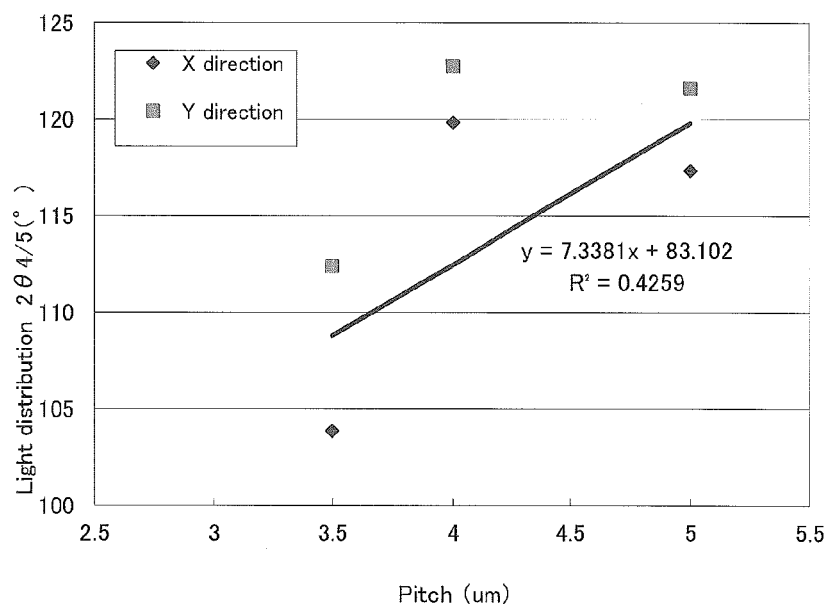
FIG. 16 is a graph showing the relationship between pitch and light distribution.

FIG. 16 is a graph showing the dependency of light distribution 2θ 4/5 on pitch. In FIG. 16, the horizontal axis corresponds to pitch I1, and the vertical axis corresponds to light distribution 2θ 4/5. As shown in FIG. 16, the smaller the pitch I1, the smaller the light distribution 2θ 4/5, whereas the larger the pitch I1, the larger the light distribution 2θ 4/5. A region having a smaller pitch I1 corresponds to the first region R201, whereas a region having a larger pitch I1 corresponds to the second region R202.

Therefore, as in the case of the second embodiment, preferably, pitch I1 is decreased in the first region R1, and pitch I1 is increased in the second region R202. In such a case, as shown in FIG. 4, light is reflected at a larger angle in the second region R2. Thus, light reflected in the second region R202 of the substrate 110 is not radiated onto the non-translucent electrodes (e.g., p-pad electrode P1 and n-pad electrode N1), but is likely to be emitted to the outside of the device.

Even if light is repeatedly reflected between the substrate 110 and the p-pad electrode P1 or the n-pad electrode N1, the number of repetitions of reflection is smaller as compared with the case of conventional light-emitting devices. This indicates that the amount of reflected light which is reabsorbed in the semiconductor layers is reduced.

FIG. 16 shows the results of experiments corresponding to the pitches I1 shown in Table 1. When a larger difference in pitch is provided between the first region R201 and the second region R202, a difference in light distribution may become larger than that shown in FIG. 16.

5-3. Driving Voltage

Figure 17:
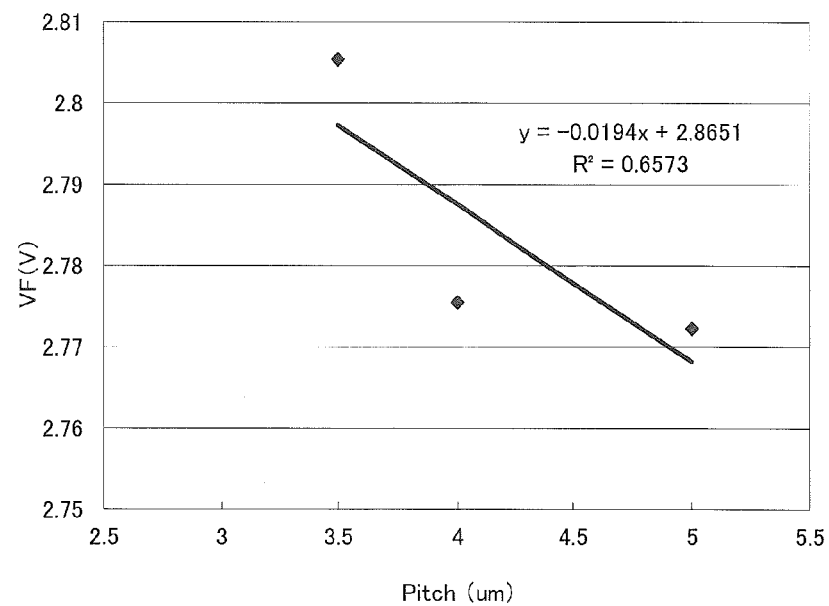
FIG. 17 is a graph showing the relationship between pitch and driving voltage.

FIG. 17 is a graph showing the dependency of driving voltage Vf on pitch. In FIG. 17, the horizontal axis corresponds to pitch I1, and the vertical axis corresponds to driving voltage Vf. As shown in FIG. 17, the smaller the pitch I1, the higher the driving voltage Vf, whereas the larger the pitch I1, the lower the driving voltage Vf.

That is, driving voltage Vf is relatively high in the first region R1 having a small pitch I1, whereas driving voltage Vf is relatively low in the second region R2 having a large pitch I1. Since the light-emitting device 200 has the second region R202, the light-emitting device 200 exhibits relatively low driving voltage Vf.

6. Modifications 6-1. n-Side Wiring Electrode

In the second embodiment, the second region R202 is provided so as to be along the p-pad electrode P1 and the p-side wiring electrode 270. Thus, the second region R202 is not provided so as to be along the n-pad electrode N1 and the n-side wiring electrode 290. However, the second region R202 may be provided so as to be along the n-side wiring electrode 290. Light entering a portion below the n-side wiring electrode 290 is reflected in the second region R202 of the substrate 210. Therefore, the light is reflected at a larger angle, and the reflected light is less likely to be radiated to the n-side wiring electrode 290.

6-2. Combination

Any of the modifications described in the first embodiment may be employed. The modifications may be employed in any combination.

7. Summary of Second Embodiment

As described above in detail, the light-emitting device 200 of the second embodiment is a semiconductor light-emitting device including dot electrodes, and wiring electrodes for connecting the dot electrodes to pad electrodes. The light-emitting device 200 of the second embodiment includes the substrate 210 having an embossed main surface. The substrate 210 has the first region R201 in which protrusions are arranged at a small pitch, and the second region R202 in which protrusions are arranged at a large pitch. The second region R202 is located in a projection area of the p-pad electrode P1 and the p-side wiring electrode 270 as viewed through the main surface of the substrate 210. Therefore, threading dislocation density is relatively high in the second region R202. Thus, the semiconductor light-emitting device includes semiconductor layers having excellent crystallinity, and realizes suppression of an increase in driving voltage Vf.

What is claimed is:

1. A Group III nitride semiconductor light-emitting device, comprising:
 a substrate including an embossed main surface;
 a Group III nitride semiconductor layer formed on the main surface of the substrate; and
 non-translucent electrodes which are electrically conducted to the Group III nitride semiconductor layer,
 wherein the substrate comprises a heterogeneous substrate having a chemical composition different from that of the Group III nitride semiconductor layer;
 wherein the heterogeneous substrate includes a first region including a plurality of protrusions, and a second region including a plurality of protrusions which are arranged at a pitch larger than that of the protrusions in the first region, each of the protrusions of the second region has a hexagonal pyramidal shape,
 wherein the second region has a perimeter being included within a region defined by a region perimeter located 6 μm or less outward from a perimeter of a projection area of each of the non-translucent electrodes as viewed through the main surface of the heterogeneous substrate, and is defined by a region perimeter located 6 μm or less inward from the perimeter of the projection area,
 wherein a portion of the semiconductor layer above the second region exhibits a threading dislocation density higher than that of a portion of the semiconductor layer above the first region, and
 wherein light distribution in the second region is larger than light distribution in the first region.

2. The Group III nitride semiconductor light-emitting device according to claim 1, wherein, in the second region, the protrusions located more distant from a boundary between the first region and the second region are arranged at a larger pitch.

3. The Group III nitride semiconductor light-emitting device according to claim 2, wherein a relation of L2=a×L1 and a relation of 1.1≤a≤3 are satisfied, wherein L1 represents a pitch between adjacent protrusions in the first region, and L2 represents a pitch between adjacent protrusions in the second region.

4. The Group III nitride semiconductor light-emitting device according to claim 3, which comprises a transparent electrode, wherein the Group III nitride semiconductor layer includes a p-type contact layer, and the transparent electrode is formed on the p-type contact layer.

5. The Group III nitride semiconductor light-emitting device according to claim 3, wherein at least one of the non-translucent electrodes comprises a pad electrode which is to be electrically conducted to an external electrode.

6. The Group III nitride semiconductor light-emitting device according to claim 5, wherein the non-translucent electrodes comprise a plurality of dot electrodes which are distributed with respect to a light-emitting surface, and one or more wiring electrodes for electrically connecting the dot electrodes to the pad electrodes, the wiring electrodes comprising comb electrodes.

7. The Group III nitride semiconductor light-emitting device according to claim 2, wherein at least one of the non-translucent electrodes comprises a pad electrode which is to be electrically conducted to an external electrode.

8. The Group III nitride semiconductor light-emitting device according to claim 7, wherein the non-translucent electrodes comprise a plurality of dot electrodes which are distributed with respect to a light-emitting surface, and one or more wiring electrodes for electrically connecting the dot electrodes to the pad electrodes, the wiring electrodes comprising comb electrodes.

9. The Group III nitride semiconductor light-emitting device according to claim 2, which comprises a transparent electrode, wherein the Group III nitride semiconductor layer includes a p-type contact layer, and the transparent electrode is formed on the p-type contact layer.

10. The Group III nitride semiconductor light-emitting device according to claim 1, wherein a relation of L2=a×L1 and a relation of 1.1≤a≤3 are satisfied, wherein L1 represents a pitch between adjacent protrusions in the first region, and L2 represents a pitch between adjacent protrusions in the second region.

11. The Group III nitride semiconductor light-emitting device according to claim 10, wherein at least one of the non-translucent electrodes comprises a pad electrode which is to be electrically conducted to an external electrode.

12. The Group III nitride semiconductor light-emitting device according to claim 11, wherein the non-translucent electrodes comprise a plurality of dot electrodes which are distributed with respect to a light-emitting surface, and one or more wiring electrodes for electrically connecting the dot electrodes to the pad electrodes, the wiring electrodes comprising comb electrodes.

13. The Group III nitride semiconductor light-emitting device according to claim 10, which comprises a transparent electrode, wherein the Group III nitride semiconductor layer includes a p-type contact layer, and the transparent electrode is formed on the p-type contact layer.

14. The Group III nitride semiconductor light-emitting device according to claim 1, wherein at least one of the non-translucent electrodes comprises a pad electrode which is to be electrically conducted to an external electrode.

15. The Group III nitride semiconductor light-emitting device according to claim 1, which comprises a transparent electrode, wherein the Group III nitride semiconductor layer includes a p-type contact layer, and the transparent electrode is formed on the p-type contact layer.

16. A Group III nitride semiconductor light-emitting device comprising:
 a substrate including an embossed main surface;
 a Group III nitride semiconductor layer formed on the main surface of the substrate; and
 non-translucent electrodes which are electrically conducted to the Group III nitride semiconductor layer, the non-translucent electrodes comprising a pad electrode, a plurality of dot electrodes which are distributed with respect to a light-emitting surface, and one or more wiring electrodes for electrically connecting the dot electrodes to the pad electrodes, the wiring electrodes comprising comb electrodes,
 wherein the substrate comprises a heterogeneous substrate including a chemical composition different from that of the Group III nitride semiconductor layer, wherein the heterogeneous substrate includes a first region including a plurality of protrusions, and a second region including a plurality of protrusions which are arranged at a pitch larger than that of the protrusions in the first region, and each of the protrusions of the second region has a hexagonal pyramidal shape, wherein the second region has a perimeter being included within a region defined by a region perimeter located 6 µm or less outward from a perimeter of a projection area of each of the non-translucent electrodes as viewed through the main surface of the heterogeneous substrate, and is defined by a region perimeter located 6 µm or less inward from the perimeter of the projection area.

17. A Group III nitride semiconductor light-emitting device, comprising:

a substrate including an embossed main surface;

a Group III nitride semiconductor layer formed on the main surface of the substrate; and non-translucent electrodes which are electrically conducted to the Group III nitride semiconductor layer, wherein the substrate comprises a heterogeneous substrate including a chemical composition different from that of the Group III nitride semiconductor layer, wherein the heterogeneous substrate includes a first region including a plurality of protrusions, and a second region including a plurality of protrusions which are arranged at a pitch larger than that of the protrusions in the first region, wherein the second region has a perimeter being included within a region defined by a region perimeter located 6 µm or less outward from a perimeter of a projection area of each of the non-translucent electrodes as viewed through the main surface of the heterogeneous substrate, and is defined by a region perimeter located 6 µm or less inward from the perimeter of the projection area, and wherein a region between a projection area of the non-translucent electrodes as viewed through the main surface of the heterogeneous substrate and an edge of the light-emitting device includes the first region.

18. The Group III nitride semiconductor light-emitting device according to claim 17, wherein the first region, the second region, the first region, the second region, and the first region are disposed in order from an edge of the light-emitting device to another edge of the light-emitting device.

19. The Group III nitride semiconductor light-emitting device according to claim 17, wherein the first region is disposed in an outermost portion of the light-emitting device.

20. The Group III nitride semiconductor light-emitting device according to claim 19, wherein, with respect to the first region, the second region is disposed in an inner portion of the light-emitting device.

* * * * *